United States Patent
Lim et al.

(10) Patent No.: US 8,264,883 B2
(45) Date of Patent: Sep. 11, 2012

(54) SEMICONDUCTOR MEMORY DEVICE AND METHOD OF READING THE SAME

(75) Inventors: Kyu Hee Lim, Seoul (KR); Seung Ho Chang, Chungcheongbuk-do (KR); Seong Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 323 days.

(21) Appl. No.: 12/765,230

(22) Filed: Apr. 22, 2010

(65) Prior Publication Data
US 2010/0329014 A1    Dec. 30, 2010

(30) Foreign Application Priority Data
Jun. 29, 2009    (KR) .................. 10-2009-0058450

(51) Int. Cl.
*G11C 11/34*    (2006.01)
*G11C 16/04*    (2006.01)
*G11C 7/10*    (2006.01)
*G11C 7/00*    (2006.01)

(52) U.S. Cl. ......... 365/185.12; 365/189.05; 365/189.15; 365/189.17

(58) Field of Classification Search ............. 365/185.12, 365/189.05, 189.15, 189.17
See application file for complete search history.

(56) References Cited

U.S. PATENT DOCUMENTS

| 7,715,231 | B2 * | 5/2010 | Kim et al. ................ 365/185.03 |
| 2007/0035995 | A1 * | 2/2007 | Crippa et al. ............ 365/185.03 |
| 2008/0013378 | A1 * | 1/2008 | Crippa et al. ............ 365/185.17 |
| 2008/0112221 | A1 * | 5/2008 | Park et al. ................ 365/185.03 |
| 2008/0285352 | A1 * | 11/2008 | Cho et al. ................ 365/185.18 |
| 2010/0172181 | A1 * | 7/2010 | Murakami ............... 365/185.12 |
| 2010/0199138 | A1 * | 8/2010 | Rho ........................... 714/746 |

FOREIGN PATENT DOCUMENTS
KR    1020090000409 A    1/2009

OTHER PUBLICATIONS

Notice of Allowance issued from Korean Intellectual Property Office on Aug. 25, 2011.

* cited by examiner

*Primary Examiner* — Ly D Pham
(74) *Attorney, Agent, or Firm* — IP & T Group LLP

(57) ABSTRACT

A semiconductor memory device includes a memory cell array including an even page cell group and an odd page cell group, and a page buffer configured to read data stored in memory cells of the even page cell group and the odd page cell group and store the read data. The page buffer comprises a first latch configured to store first even page data of the even page cell group when a first read operation is performed, a second latch configured to store odd page data of the odd page cell group when a second read operation is performed, and a third latch configured to store second even page data of the even page cell group when a third read operation is performed.

12 Claims, 4 Drawing Sheets

SEMICONDUCTOR MEMORY DEVICE AND METHOD OF READING THE SAME

CROSS-REFERENCE TO RELATED APPLICATION

Priority to Korean patent application number 10-2009-0058450 filed on Jun. 29, 2009, the entire disclosure of which is incorporated by reference herein, is claimed.

BACKGROUND

Exemplary embodiments relate to a semiconductor memory device and a method of reading the same and, more particularly, to a semiconductor memory device, which is capable of outputting correct data by changing a read voltage in response to interference resulting from neighboring memory cells, and a method of reading the same.

In a flash memory device, memory cells are coupled together in series such that neighboring memory cells share their sources and drains thereby forming a cell string. Further, a cell string may be coupled to a bit line. Each memory cell typically has a transistor structure in which a floating gate and a control gate are stacked. A memory cell array is directly formed within a P type well formed in a P type substrate or an N type substrate. The drain of a NAND cell is coupled to a bit line via a selected gate, and the source thereof is coupled to a source line via the selected gate. The control gates of the memory cells are consecutively arranged in a row direction and are coupled to a word line.

The operation of the NAND flash memory device is described below. A data program operation is performed starting from a memory cell which is the farthest from a bit line. High voltage Vpp is supplied to the control gate of a selected memory cell, and an intermediate voltage is supplied to the control gate and the selected gate of a memory cell placed closer to a bit line. 0 V or an intermediate voltage is supplied to the bit line in response to the value of data. When 0 V is supplied to the bit line, the corresponding voltage level is transferred to the drain of the selected memory cell, and electrons are then injected into the floating gate. Accordingly, the critical value of the selected memory cell shifts in the positive direction.

Recently, to further increase the degree of integration of flash memory devices, active research is being carried out on a multi-bit cell capable of storing plural data in a single memory cell. This type of a memory cell is called a multi-level cell (MLC). A memory cell capable of storing a single bit is called a single level cell (SLC).

An MLC typically has two or more distributions of a threshold voltage and has two or more data storage states corresponding to the two or more distributions. An MLC capable of storing data of 2 bits has four data storage states (i.e., [11], [10], [00], and [01]). Distributions of the four data storage states correspond to distributions of a threshold voltage of the MLC.

For example, assuming that distributions of a threshold voltage of a memory cell are −2.7 V or less, 0.3 V to 0.7 V, 1.3 V to 1.7 V, and 2.3 V to 2.7 V, the data storage state [11] can correspond to −2.7 V or less, the data storage state [10] can correspond to 0.3 V to 0.7 V, the data storage state [00] can correspond to 1.3 V to 1.7 V, and the data storage state [01] can correspond to 2.3 V to 2.7 V. That is, if a distribution of the threshold voltage of the MLC corresponds to one of the four distributions of the threshold voltage, corresponding data information of 2 bits, from among the data storage states [11], [10], [00], and [01], is stored in the MLC.

As described above, the MLC has a number of distributions of a threshold voltage corresponding to the number of bits that can be stored. More specifically, an MLC capable of storing m bits has $2^m$ distributions of a cell voltage.

FIG. 1 is a graph showing distributions of program threshold voltages of a known semiconductor memory device.

The program operation of a flash memory device of semiconductor memory devices is performed on a page basis. The pages are classified into even and odd pages, each sharing the same word line. In general, the program operation is first performed on the even page and then performed on the odd page.

Referring to FIG. 1, the program operation of a semiconductor memory device normally has a distribution A of a threshold voltage because of a program operation for an even page group. After the program operation is performed on an odd page group, the threshold voltage rises due to coupling with neighboring memory cells, thus shifting to a distribution B of the threshold voltage. Such a phenomenon is referred to as an interference phenomenon. The interference phenomenon is increased when the odd page group is programmed with a second state 'state 2' and a fourth state 'state 4' which have a greater shift of a threshold voltage than a first state 'state 1' and a third state 'state 3' which have a smaller shift of a threshold voltage.

If, as described above, the distribution of a threshold voltage rises, error can occur in a read operation for an even page group, thereby reducing reliability of the memory device.

BRIEF SUMMARY

Exemplary embodiments relate to a semiconductor memory device and a method of reading the same, wherein data of an even page are read using a first read voltage and stored in a first latch, data of an odd page are read using the first read voltage and stored in a second latch, data of the even page are read using a second read voltage higher than the first read voltage and stored in a third latch, and the data stored in the first latch or the data stored in the third latch are outputted as final even page data in response to a value of the data of the odd page, which is stored in the second latch.

An aspect of the present disclosure provides a semiconductor memory device including a memory cell array, including an even page cell group and an odd page cell group, and a page buffer configured to read data stored in memory cells of the even page cell group and the odd page cell group and store the read data. The page buffer includes a first latch configured to store first even page data of the even page cell group when a first read operation is performed, a second latch configured to store odd page data of the odd page cell group when a second read operation is performed, and a third latch configured to store second even page data of the even page cell group when a third read operation is performed.

The page buffer may be configured to output the read data, stored in the first or third latch, as final even page data in response to a value of the read data stored in the second latch.

The page buffer may further include a MUX unit configured to output the read data, stored in the first or third latch, as final even page data in response to the value of the read data stored in the second latch.

The first read operation may be performed by supplying a first read voltage to a selected word line coupled to the even page cell group.

The third read operation may be performed by supplying the selected word line coupled to the even page cell group with a second read voltage, which is higher than the first read voltage by a certain voltage.

The second read voltage is higher than the first read voltage by an amount of a shift of a threshold voltage resulting from interference.

Another aspect of the present disclosure provides a method of reading a semiconductor memory device, including an even page cell group and an odd page cell group. The method includes performing a first read operation on the even page cell group and storing first data read from the even page cell group, performing a read operation on the odd page cell group and storing odd page cell data read from the odd page cell group, performing a second read operation on the even page cell group and storing second data read from the even page cell group, and outputting the first data or the second data as final even page cell data in response to a value of the odd page cell data read from the odd page cell group.

The first read operation may be performed by supplying a first read voltage to a selected word line coupled to the even page cell group.

The second read operation may be performed by supplying the selected word line with a second read voltage, which is higher than the first read voltage.

The second read voltage is higher than the first read voltage by an amount of a shift of a threshold voltage resulting from interference.

The method may further include outputting the first data as the final even page cell data, if the value of the odd page cell data read from the odd page cell group corresponds to a first or third state of a distribution of a threshold voltage when a program operation is performed, and outputting the second data as the final even page cell data, if the value of the odd page cell data read from the odd page cell group corresponds to a second or fourth state of a distribution of a threshold voltage when a program operation is performed.

When the program operation is performed, the amount of a shift of the distribution of the threshold voltage of the first or third state is smaller than that of the distribution of the threshold voltage of the second or fourth state.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 2:
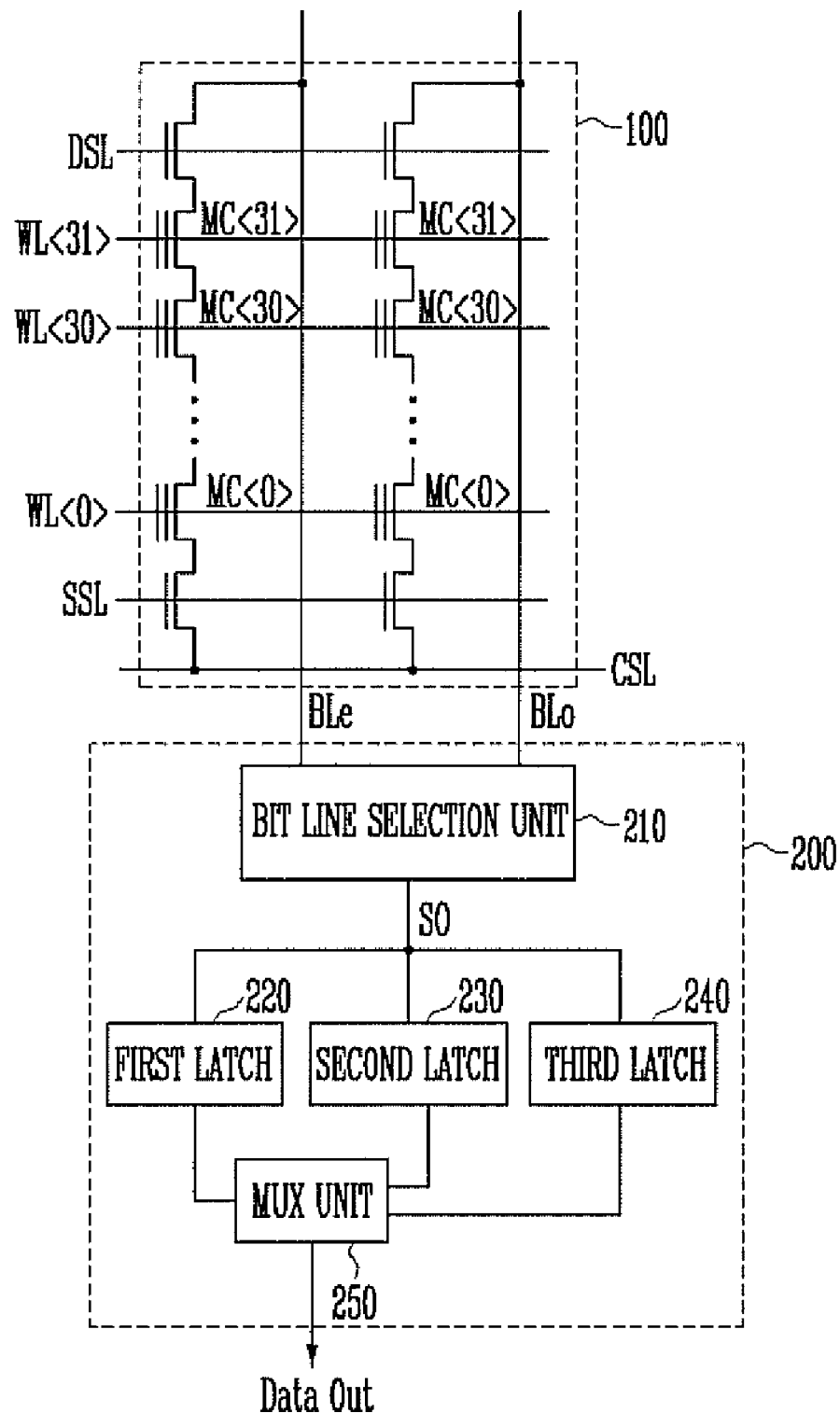
FIG. 2 shows the construction of a semiconductor memory device according to an embodiment of this disclosure.

FIG. 2 shows the construction of a semiconductor memory device according to an embodiment of this disclosure.

Referring to FIG. 2, a memory cell array 100 includes groups of memory cells MC0 to MC31. Each of the groups of memory cells MC<0> to MC<31> is coupled in series to an even or odd bit line BLe or BLo, thus forming a cell string. Although, in FIG. 1, one even bit line and one odd bit line are illustrated, a number of the even and odd bit lines BLe and BLo may be alternately arranged. Here, a group of the memory cells coupled to the same word line and coupled to the even bit lines BLe is referred to as an even page cell group, and a group of the memory cells coupled to the same word line and coupled to the odd bit lines BLo is referred to as an odd page cell group. A program operation is performed on memory cells belonging to the same page cell group at the same time. In general, the program operation is first performed on the even page cell group and then performed on the odd page cell group.

A page buffer 200 is coupled to the even and odd bit lines BLe and BLo and configured to latch data of selected memory cells (e.g., MC<30>) coupled to the even and odd bit lines BLe and BLo when a read operation is performed.

The page buffer 200 includes a bit line selection unit 210, a first latch 220, a second latch 230, a third latch 240, and a MUX unit 250. The bit line selection unit 210 is configured to select one of the even and odd bit lines BLe and BLo. The first latch 220 is configured to read and store data stored in a selected memory cell of the even page cell group using a first read voltage. The second latch 230 is configured to read and store data stored in a selected memory cell of the odd page cell group using the first read voltage. The third latch 240 is configured to read and store data stored in a selected memory cell of the even page cell group using a second read voltage. The MUX unit 250 is configured to output the data stored in the first latch 220 or the data stored in the third latch 240 as output data in response to a value of the data stored in the second latch 230. The MUX unit 250 includes a switch circuit configured to output data stored in the first latch 220 or data stored in the third latch 240 as output data in response to a value of data stored in the second latch 230.

Figure 3:
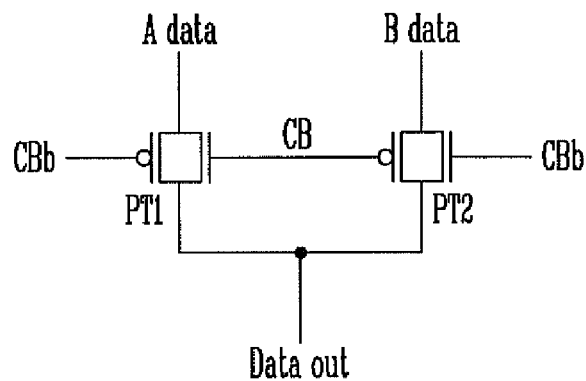
FIG. 3 is a circuit diagram of a MUX unit shown in FIG. 2.

FIG. 3 is a circuit diagram of the MUX unit 250 shown in FIG. 2.

Referring to FIG. 3, the MUX unit includes first and second pass transistors PT1 and PT2. The first pass transistor PT1 is configured to output data 'A data', stored in the first latch 220, as output data in response to control signals CB and CBb depending on a value of data stored in the second latch 230. The second pass transistor PT2 is configured to output data 'B data', stored in the third latch 240, as output data in response to the control signals CB and CBb depending on a value of data stored in the second latch 230. More specifically, when a value of data stored in the second latch 230 is '1', the first pass transistor PT1 outputs the data 'A data', stored in the first latch 220, as output data. If a value of data stored in the second latch 230 is '0', the second pass transistor PT2 outputs the data 'B data', stored in the third latch 240, as output data.

Figure 4:
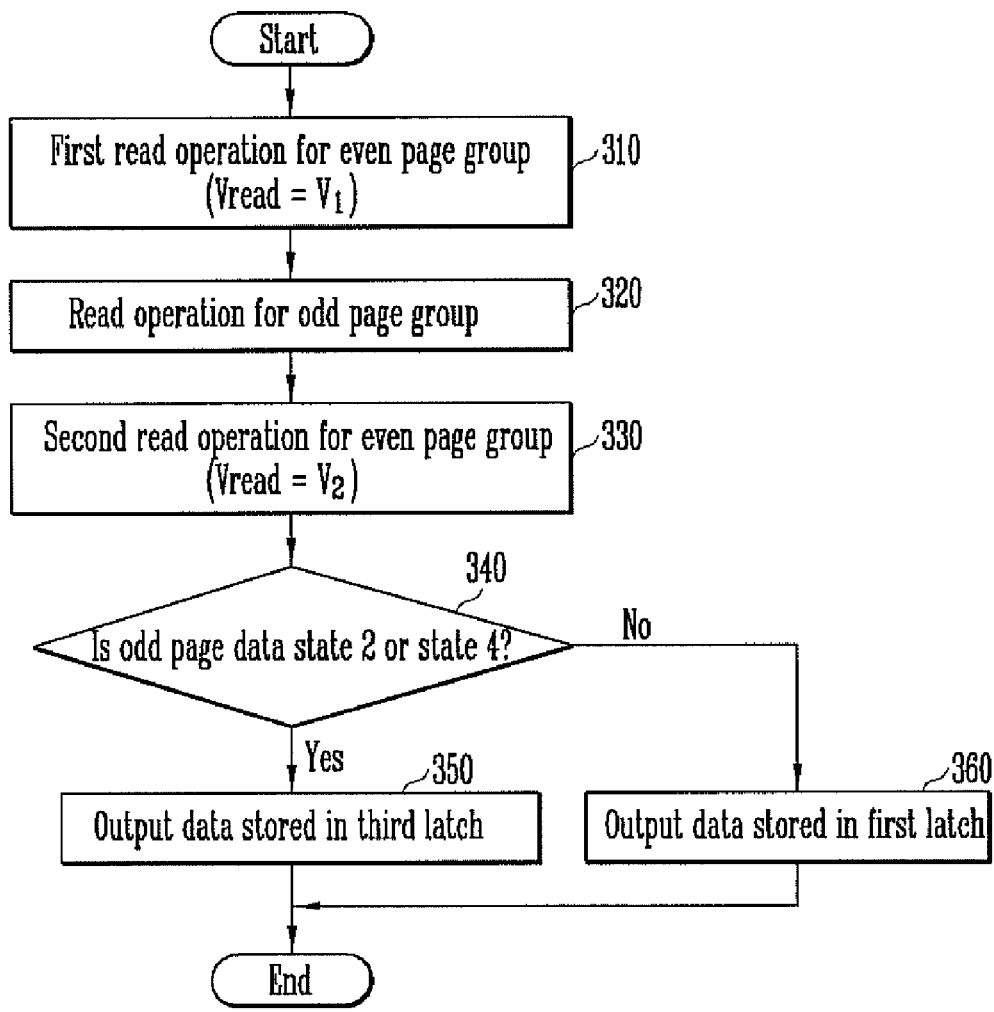
FIG. 4 is a flowchart illustrating a method of reading a semiconductor memory device according to an embodiment of this disclosure.
Figure 5:
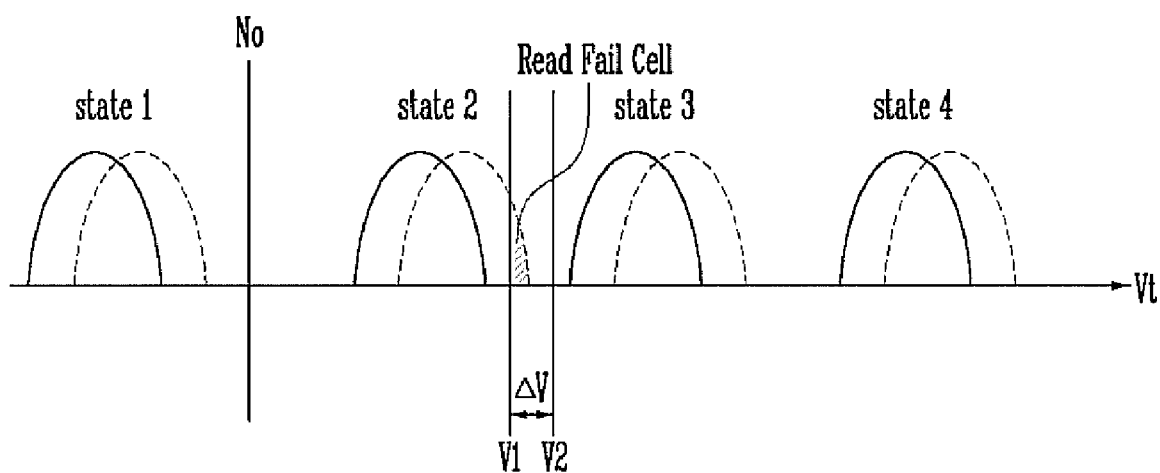
FIG. 5 is a graph showing distributions of threshold voltages for illustrating a method of reading a semiconductor memory device according to an embodiment of this disclosure.

FIG. 4 is a flowchart illustrating a method of reading a semiconductor memory device according to an embodiment of this disclosure, and FIG. 5 is a graph showing distributions of threshold voltages for illustrating a method of reading a semiconductor memory device according to an embodiment of this disclosure.

The method of reading a semiconductor memory device according to an embodiment of this disclosure is described below with reference to FIGS. 2 to 5.

A first read operation using a first read voltage (Vread=V1) is performed on even page cells, and data read from the even page cells (hereinafter referred to as 'even page cell data') are stored in the first latch 220 of the page buffer 200 at step 310. In more detail, the first read voltage (Vread=V1) is supplied to a selected word line (e.g., WL<30>), and a pass voltage is supplied to the remaining word lines WL<31> and WL<29> to WL<0>. A read voltage supplied when a typical read operation is performed preferably is used as the first read voltage (Vread=V1). The bit line selection unit 210 selects a bit line (e.g., the even bit line BLe), couples the even bit line BLe to a sense node SO, and stores the even page cell data in the first latch 220 via the sense node SO.

Next, the read operation is performed on odd page cells, and data read from the odd page cells (hereinafter referred to as 'odd page cell data') are stored in the second latch 230 at step 320. The read operation for the odd page cells is performed in a similar way to the read operation for the even page cells. Here, the first read voltage (Vread=V1) is used as a read voltage supplied when the read operation is performed on the odd page cells.

Here, in the case in which a program state of memory cells (e.g., MC<30>) coupled to the odd bit lines BLo is the first or third states 'state 1' or 'state 3,' which experience a small shift of a threshold voltage during a program operation, first data '1' are stored in the second latch 230. In the case in which a program state of the memory cells coupled to the odd bit lines BLo is the second or fourth states 'state 2' or 'state 4,' which experience a relatively great shift of a threshold voltage during a program operation, second data '0' are stored in the second latch 230. If a program state of the memory cells (e.g., MC<30>) coupled to the odd bit lines BLo is the first or third state 'state 1' or 'state 3', an interference phenomenon resulting from memory cells (e.g., MC<30>) coupled to the even bit lines BLe is small, and so a distribution of the threshold voltages is shifted a little. If a program state of the memory cells (e.g., MC<30>) coupled to the odd bit lines BLo is the second or fourth state 'state 2' or 'state 4', an interference phenomenon resulting from memory cells (e.g., MC<30>) coupled to the even bit lines BLe is relatively great, and so a distribution of the threshold voltages is greatly shifted. Accordingly, different data—the first data '1' and the second data '0'—are stored in the second latch 230 in order to distinguish the memory cells having different shifts of threshold voltages.

A second read operation using a second read voltage (Vread=V2) is performed on the even page cells, and data read from the even page cells (hereinafter referred to as 'even page cell data') are stored in the third latch 240 of the page buffer 200 at step 330. In more detail, the second read voltage (Vread=V2), which is higher than the first read voltage (Vread=V1) by a certain voltage difference ΔV, is supplied to the selected word line (e.g., WL<30>), and a pass voltage is supplied to the remaining word lines WL<31> and WL<29> to WL<0>. The second read voltage (Vread=V2) can be set to be higher than the first read voltage (Vread=V1) by the amount of a shift of a threshold voltage resulting from interference.

Figure 1:
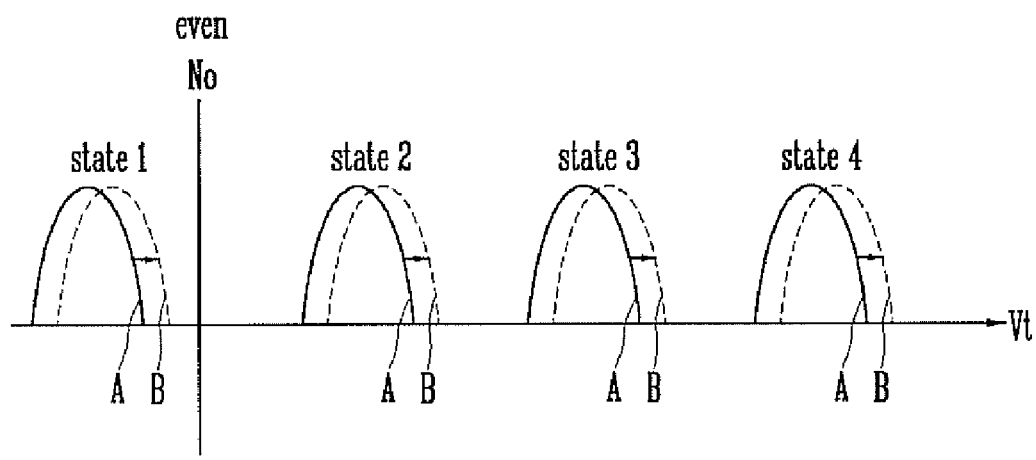
FIG. 1 is a graph showing distributions of program threshold voltages of a known semiconductor memory device.
Figure 1:
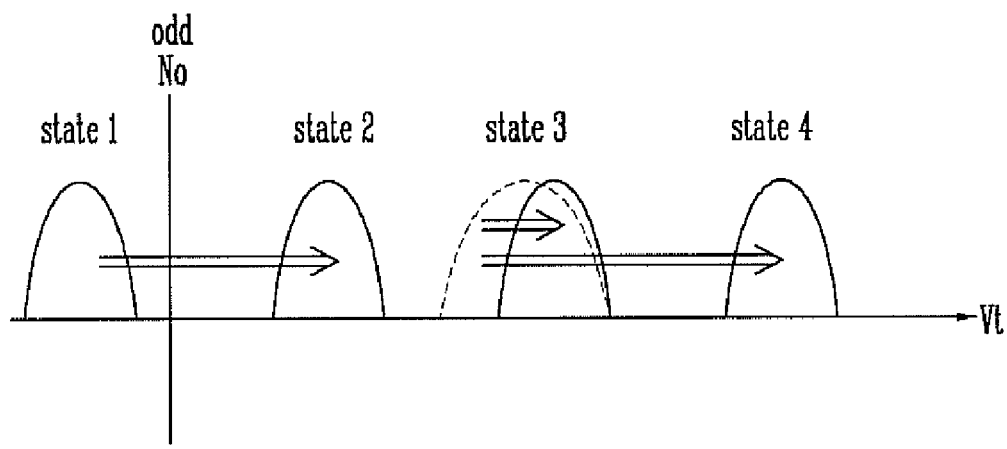

If a program state of memory cells (e.g., MC<30>) coupled to the odd bit lines BLo is the second or fourth state 'state 2' or 'state 4', interference resulting from the memory cells MC<30> coupled to the even bit lines BLe is relatively great, and so a distribution of a threshold voltage shifts from A to B (refer to FIG. 1). Accordingly, if the read operation using the first read voltage (Vread=V1) is performed, cells determined to be read fail cells may be determined to be normal cells when the read operation using the second read voltage (Vread=V2) is performed.

The MUX unit 250 of the page buffer 200 determines whether a value of data stored in the second latch 230 corresponds to the second or fourth state 'state 2' or 'state 4' (i.e., the second data '0') at step 340. If, as a result of the determination, the value of data stored in the second latch 230 is determined to be the data corresponding to 'state 1' or 'state 3' (i.e., the first data '1'), the MUX unit 250 outputs the data stored in the first latch 220 as final even page cell data at step 360. If, as a result of the determination, the value of data stored in the second latch 230 is determined to be the data corresponding to 'state 2' or 'state 4' (i.e., the second data '0'), the MUX unit 250 outputs the data stored in the third latch 240, as the final even page cell data at step 350.

As described above, even page cell data are read using each of the first read voltage (Vread=V1) and the second read voltage (Vread=V2), the first and second data (e.g., '1' and '0') are temporarily stored in the page buffer, and the first or second data are output as the final even page cell data in response to a value of programmed odd page cell data. Accordingly, reliability of the memory device can be improved.

As described above, according to the present disclosure, data of an even page are read using a first read voltage and stored in the first latch. Data of an odd page are read using the first read voltage and stored in the second latch. Data of the even page are read using a second read voltage, which is higher than the first read voltage, and stored in the third latch. The data stored in the first latch or the data stored in the third latch are outputted as final even page data in response to a value of the data of the odd page, which is stored in the second latch. Accordingly, although a distribution of a threshold voltage of even pages shifts due to data programmed into odd pages, correct data can be read using a read voltage for which the amount of a shift has been compensated, and so reliability of the memory device can be improved.

What is claimed is:

1. A semiconductor memory device, comprising:
    a memory cell array including an even page cell group and an odd page cell group; and
    a page buffer configured to read data stored in memory cells of the even page cell group and the odd page cell group and store the read data,
    wherein the page buffer comprises:
    a first latch configured to store first even page data of the even page cell group when a first read operation is performed;
    a second latch configured to store odd page data of the odd page cell group when a second read operation is performed; and
    a third latch configured to store second even page data of the even page cell group when a third read operation is performed.

2. The semiconductor memory device of claim 1, wherein the page buffer is configured to output the read data, stored in the first or third latch, as final even page data in response to a value of the read data stored in the second latch.

3. The semiconductor memory device of claim 1, wherein the page buffer further comprises a MUX unit configured to output the read data, stored in the first or third latch, as final even page data in response to a value of the read data stored in the second latch.

4. The semiconductor memory device of claim 1, wherein the first read operation is performed by supplying a first read voltage to a selected word line coupled to the even page cell group.

5. The semiconductor memory device of claim 4, wherein the third read operation is performed by supplying the selected word line coupled to the even page cell group with a second read voltage, which is higher than the first read voltage by a certain voltage.

6. The semiconductor memory device of claim 5, wherein the second read voltage is higher than the first read voltage by an amount of a shift of a threshold voltage resulting from interference.

7. A method of reading a semiconductor memory device, comprising an even page cell group and an odd page cell group, the method comprising:
- performing a first read operation on the even page cell group and storing first data read from the even page cell group;
- performing a read operation on the odd page cell group and storing odd page cell data read from the odd page cell group;
- performing a second read operation on the even page cell group and storing second data read from the even page cell group; and
- outputting the first data or the second data as final even page cell data in response to a value of the odd page cell data read from the odd page cell group.

8. The method of claim 7, wherein the first read operation is performed by supplying a first read voltage to a selected word line coupled to the even page cell group.

9. The method of claim 8, wherein the second read operation is performed by supplying the selected word line with a second read voltage, which is higher than the first read voltage.

10. The method of claim 9, wherein the second read voltage is higher than the first read voltage by an amount of a shift of a threshold voltage resulting from interference.

11. The method of claim 7, further comprising:
- outputting the first data as the final even page cell data, if the value of the odd page cell data read from the odd page cell group corresponds to a first or third state of a distribution of a threshold voltage when a program operation is performed, and
- outputting the second data as the final even page cell data, if the value of the odd page cell data read from the odd page cell group corresponds to a second or fourth state of a distribution of a threshold voltage when a program operation is performed.

12. The method of claim 11, wherein when the program operation is performed, an amount of a shift of the distribution of the threshold voltage of the first or third state is smaller than that of the distribution of the threshold voltage of the second or fourth state.

* * * * *